United States Patent [19]

Hongou

[11] Patent Number: 5,166,474
[45] Date of Patent: Nov. 24, 1992

[54] SUPERCONDUCTING DEVICE

[75] Inventor: Masashi Hongou, Atsugi, Japan

[73] Assignee: Semiconductor Energy Laboratory Co., Ltd., Kanagawa, Japan

[21] Appl. No.: 398,418

[22] Filed: Aug. 25, 1989

[30] Foreign Application Priority Data

Sep. 2, 1988 [JP] Japan ................................ 63-220029

[51] Int. Cl.⁵ ........................ H05K 9/00; H01L 39/02
[52] U.S. Cl. .................................... 174/35 R; 505/1; 505/700; 505/875; 505/885; 174/35 MS; 174/15.4; 174/15.5
[58] Field of Search ................... 505/1, 875, 885, 886, 505/807, 808, 809, 872, 878, 892, 894, 888, 896, 897, 898, 899, 700; 174/15.4, 15.5, 35 R, 35 MS; 335/216

[56] References Cited

U.S. PATENT DOCUMENTS 5,049,540 9/1991 Park et al. ............................ 505/1

FOREIGN PATENT DOCUMENTS 3319069 12/1988 Japan .
0003014 1/1989 Japan .
0093403 4/1989 Japan .

Primary Examiner—Leo P. Picard
Assistant Examiner—Bot L. Ledynh
Attorney, Agent, or Firm—Sixbey, Friedman, Leedom & Ferguson

[57] ABSTRACT

Superconducting fluids are disclosed. The fluid is made by dispersing a superconducting oxide ceramic powder in a liquid nitrogen. A magnetic field shielding device is constructed by disposing the fluid in a suitable container which is adapted to have the superconducting fluid surrounding a space to be shielded from an external magnetic field.

10 Claims, 3 Drawing Sheets

SUPERCONDUCTING DEVICE

BACKGROUND OF THE INVENTION

The present invention relates to superconducting device, and the application thereof such as magnetic field shielding devices.

Superconducting materials have been formed in a variety of shapes, e.g. bulks, thin films and wirings. Particularly, superconducting wirings are particularly demanded to form superconducting coils. Superconducting oxide ceramic materials, which have been attracted the interest of researchers because of their high Tc, have poor flexibility and therefore the formation of wirings is very difficult. While efforts have been made aimed at forming coils from fragile ceramics, it will be welcome to use the recent ceramic materials making effective use of their advantages rather than disadvantages.

Accordingly, suitable applications of such oxide ceramic superconductors have been demanded in order to utilize the advantage of the high Tc.

SUMMARY OF THE INVENTION

It is therefore an object of the present invention to provide superconducting magnetic device.

In order to accomplish the above and other objects and advantages, a powdered superconducting ceramic material is dispersed in a liquid. The superconducting fluid can be used as a magnetic field shielding medium. On the other hand, the movement of the fluid superconducting ceramic can be controlled by applying a magnetic field thereto by virtue of the magnetic property of the superconducting ceramic.

The particle size of the superconducting powder to be dispersed is, for example, $10^{-7}$ to $10^{-1}$ centimeter. Smaller particle sizes are desirable to form well-dispersed state of the powders. However, in view of obtaining suitable superconductivity, larger particle sizes are rather preferred. Accordingly, more suitable particle sizes are preferably $10^{-5}$ to $10^{-4}$ centimeter.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 1:
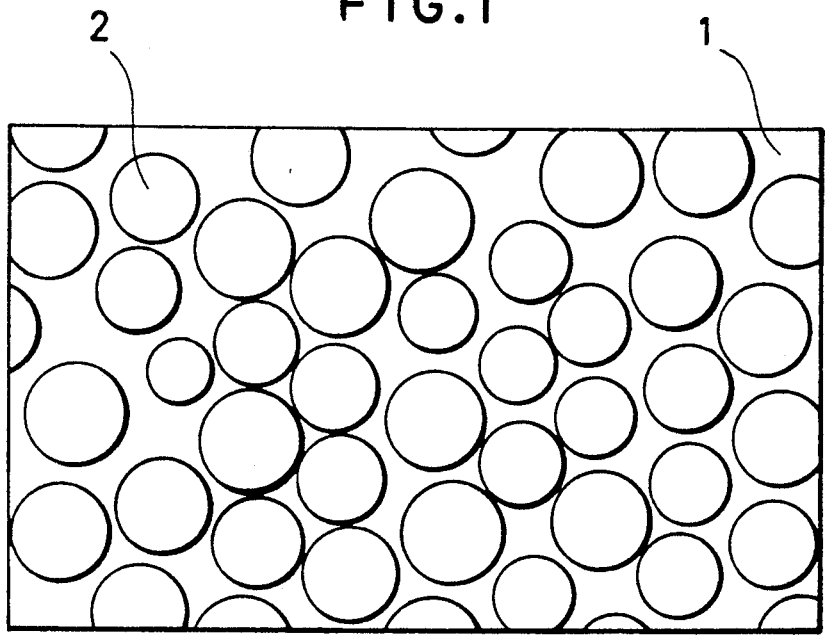
FIGS. 1 and 2 are schematic diagrams showing distribution conditions in which superconducting powders are distributed in liquid.
Figure 2:
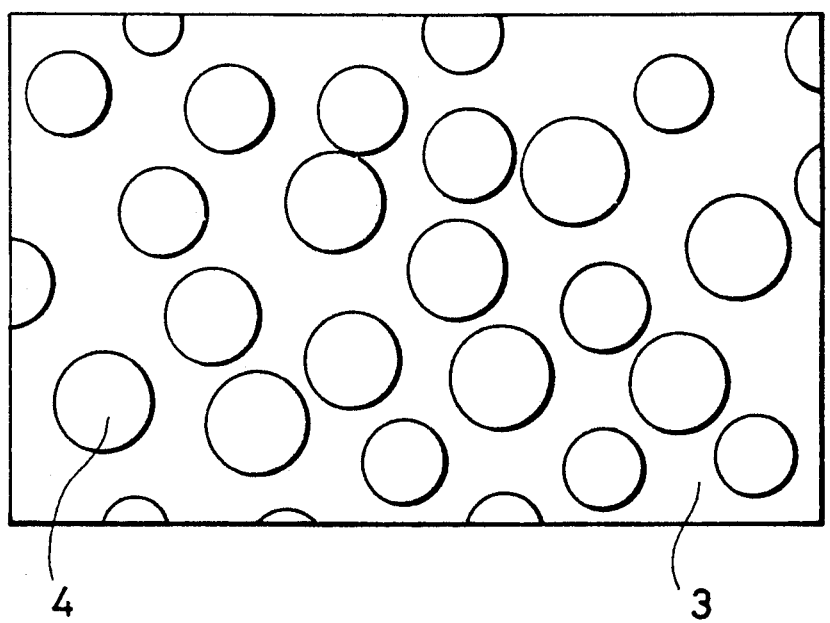

In accordance with the present invention, superconducting powders are dispersed in a liquid. The liquid is chosen from, for example, liquid helium, liquid nitrogen, liquid argon and the like since the critical temperatures of superconducting ceramics now available are usually lower than 100° K., at which many liquids freeze. Desirably, superconducting powders are dissolved in a liquid to form a colloidal state as schematically illustrated in FIG. 2. Alternatively, an amount of liquid can be applied to superconducting powders in order to fill the spaces between the particles of the powder.

Prescribed amounts of powders of $Y_2O_3$, $BaCO_3$, and $CuO$ of 99.9% or higher purity respectively were sufficiently mixed in the ratio of 1:2:3 conforming to a target composition of $YBa_2Cu_3O_{7-x}$ and fired at 900° C. for 12 hours, followed by gradually cooling. The fired ceramic material was then ground into a powder having an average particle size of $10^{-4}$ to $10^{-5}$ centimeter. This superconducting powder was named Sample A. Also, the same amounts of powders conforming to the target material of $YBa_2Cu_3O_{7-x}$ was dissolved in nitric acid and dried by spray drying method to obtain the target material in superconducting powder form. This powder was named Sample B. The latter method of forming superconducting powders.

Figure 3:
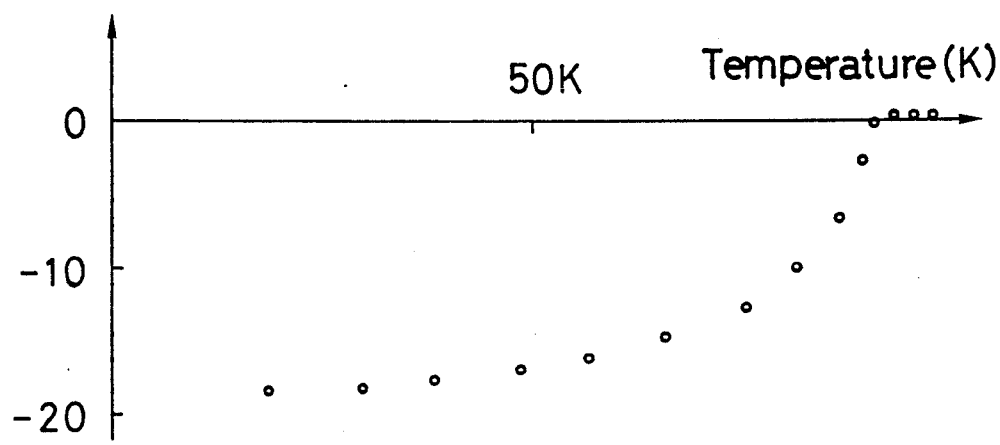
FIGS. 3 and 4 are graphical diagrams showing the susceptibilities of magnetic fluids versus temperature in accordance with the present invention.
Figure 4:
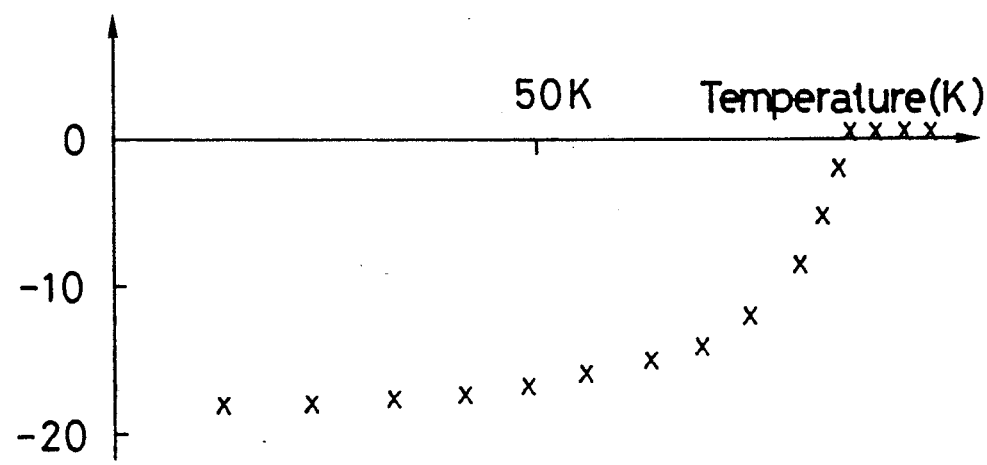

FIGS. 3 and 4 are graphical diagrams showing the magnetic susceptibilities of Sample A and Sample B respectively with changing temperature. As shown in the figures, the critical temperatures of the both samples were about 90° K.

Figure 5A:
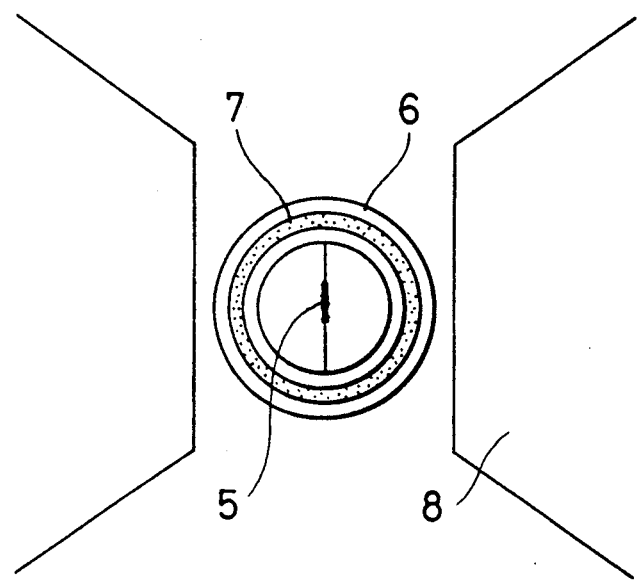
FIGS. 5(A) and 5(B) are plan and side sectional views showing a magnetic field shielding device in accordance with the present invention.
Figure 5B:
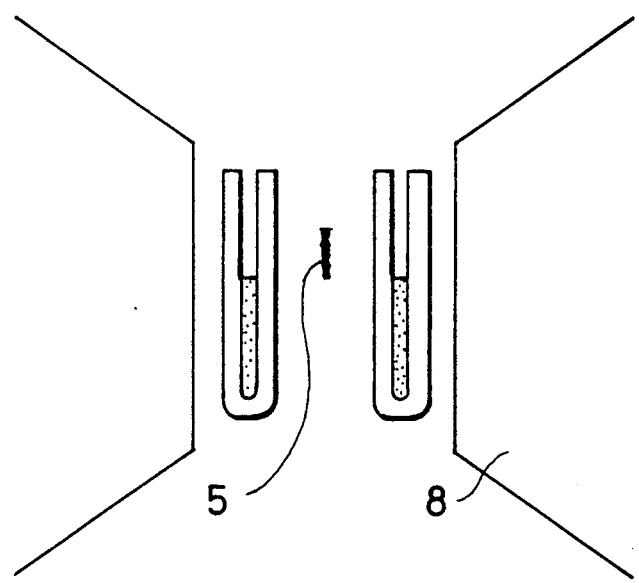

The superconducting fluid was disposed in a cylindrical container as shown in FIGS. 5(A) and 5(B). The container comprises a cylindrical inside 7 which is isolated from outside by inner and outer vacuum gaps 6 in order to avoid heat transfer. A hole device was placed in the center of the container and a magnetic field was externally applied thereto by means of an electromagneto 8. The following table shows the relationship between the strength of the applied external magnetic field and the strength of the internal magnetic field sensed by the hole sensor.

TABLE

| External Magnetic Field | A | B | C |
| --- | --- | --- | --- |
| 0 | 0 | 0 | 0 |
| 20 | 1 | 0 | 0 |
| 50 | 3 | 1 | 1 |
| 100 | 5 | 4 | 3 |
| 500 | 420 | 418 | 422 |
| 1000 | 910 | 905 | 901 |

Figure 6:
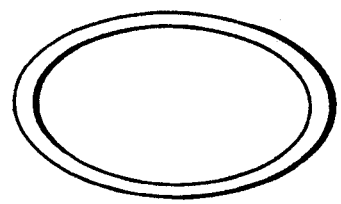
FIG. 6 is a perspective view showing a copper ring used in the magnetic field shielding device shown in FIGS. 5(A) and 5(B).

In the table, A, B and C were obtained respectively with Sample A, Sample B and Sample A and a cupper ring as shown in FIG. 6 which had been put on the upper surface of the superconducting fluid in order not to allow the motion of the fluid. The unit of the figure is oersted. The shape of the container is arbitrary. For example, the flusk-like container can be used.

While several embodiments have been specifically described by way of examples, it is to be appreciated that the present invention is not limited to the particular examples described and that modifications and variations can be made without departing from the scope of the invention as defined by the appended claims. For example, superconducting powders can be made from superconducting metals, alloys, or other oxide ceramic superconducting materials.

What is claimed is:

1. A superconducting device comprising
   a container having an arbitrary configuration:
   a liquid held in the container;
   a superconducting powder dispersed in the liquid
     wherein a freezing point of the liquid is not higher than a critical temperature of the superconducting powder;

means for maintaining the superconducting powder within the liquid; and means for positioning the container in a predetermined position so that the liquid having the superconducting powder dispersed therein can be utilized as a superconducting device.

2. The superconducting fluid of claim 1 wherein said superconducting powder is an oxide ceramic superconducting ceramics.

3. The superconducting fluid of claim 1 wherein said liquid is liquid nitrogen.

4. The superconducting fluid of claim 1 wherein the particle size of said superconducting powder is $10^{-7}$ to $10^{-1}$ centimeter.

5. The superconducting fluid of claim 1 wherein the particle size of said superconducting powder is $10^{-5}$ to $10^{-4}$ centimeter.

6. A magnetic shield device comprising:

a liquid held in a container where the container has an arbitrary configuration;

a superconducting powder dispersed in the liquid wherein a freezing point of the liquid is not higher than a critical temperature of the superconducting powder;

means for maintaining the superconducting powder within the liquid; and means for interposing the container between a magnetic field source and an area to be shielded from the magnetic field so that the liquid having the superconducting powder dispersed therein can shield the area from the magnetic field.

7. The device of claim 6 wherein said superconducting powder is an oxide ceramic superconducting ceramics.

8. The superconducting fluid of claim 6 wherein said liquid is liquid nitrogen.

9. The superconducting fluid of claim 6 wherein the particle size of said superconducting powder is $10^{-7}$ to $10^{-1}$ centimeter.

10. The superconducting fluid of claim 6 wherein the particle size of said superconducting powder is $10^{-5}$ to $10^{-4}$ centimeter.

* * * * *